United States Patent [19]

Suzuki

[11] Patent Number: 4,551,744
[45] Date of Patent: Nov. 5, 1985

[54] HIGH SWITCHING SPEED SEMICONDUCTOR DEVICE CONTAINING GRADED KILLER IMPURITY

[75] Inventor: Kensuke Suzuki, Hitachi, Japan
[73] Assignee: Hitachi, Ltd., Tokyo, Japan
[21] Appl. No.: 403,328
[22] Filed: Jul. 30, 1982
[30] Foreign Application Priority Data
   Jul. 31, 1981 [JP] Japan .................. 56-119087
[51] Int. Cl.$^4$ .................. H01L 29/167; H01L 29/74
[52] U.S. Cl. ........................ 357/64; 357/38; 357/90
[58] Field of Search ............ 357/68, 38, 38 S, 88, 357/64, 90

[56] References Cited
   U.S. PATENT DOCUMENTS

| | | | |
|---|---|---|---|
| 3,067,485 | 12/1962 | Ciccolella | 357/64 |
| 3,440,113 | 4/1969 | Wolley | 357/38 |
| 3,485,684 | 12/1969 | Mann et al. | 357/88 |
| 3,487,276 | 12/1969 | Wolley | 357/64 |
| 4,259,683 | 3/1981 | Adler et al. | 357/64 |

FOREIGN PATENT DOCUMENTS
1447763 9/1976 United Kingdom ............ 357/64

OTHER PUBLICATIONS

*Switching Phen. in Reverse-Biased Gold-Diffused Si P+-i-N+Diodes*, Supadech et al., Pro. of IEEE vol. 67, No. 4, Apr. 1979, 692–693.

Primary Examiner—Martin H. Edlow
Assistant Examiner—Terri M. Henn
Attorney, Agent, or Firm—Antonelli, Terry & Wands

[57] ABSTRACT

A semiconductor device for controlling a current comprises a pn junction formed of a high resistivity region and a relatively low resistivity region, a graded distribution of dislocation density is formed in the high resistivity region and decreases with an increase in distance from the pn junction, also graded distribution of lifetime killer concentration is formed in the high resistivity region and decreases with an increase in distance from the pn junction in correspondence with the graded distribution of dislocation density.

6 Claims, 8 Drawing Figures ns. Accordingly, the lifetime killers in the vicinity of the pn junction are particularly effective to reduce the reverse recovery time. Since the lifetime of the minority carriers in the high impurity density region is short, the lifetime of the high resistivity $n^-$ or $p^-$ region principally determines the recovery time when a $p^+n^-$ or $p^-n^+$ junction is included.

HIGH SWITCHING SPEED SEMICONDUCTOR DEVICE CONTAINING GRADED KILLER IMPURITY

BACKGROUND OF THE INVENTION

The present invention relates to a high switching speed semiconductor device more particularly the present invention relates to a semiconductor device having a small leakage current and exhibiting a good pulse response, and a method for manufacturing the same.

In the prior art, in order to shorten a recovery time of a semiconductor device having a pn junction to improve a pulse response, it has been proposed to dope an impurity (lifetime killer) such as gold or platinum for reducing a lifetime of minority carriers in the semiconductor device. For example, U.S. Pat. No. 3,067,485 discloses a high switching speed semiconductor diode having Au or Pt uniformly doped to a saturation level into a substrate. When the lifetime killer is doped, a reverse recovery time of the pn junction is reduced. Unfortunately, a leakage current in a reverse blocking state increases with such doping.

OBJECT OF THE INVENTION

It is an object of the present invention to provide a semiconductor device having a pn junction which exhibits a short reverse recovery time and a small leakage current and a method for manufacturing the same.

SUMMARY OF THE INVENTION

In accordance with a preferred embodiment of the present invention, there is provided a semiconductor device comprising a pn junction for controlling a current by a polarity of a bias voltage, a high resistivity region adjacent to the pn junction and a lifetime killer distributed in the high resistivity region with a concentration decreasing as a distance from the pn junction increases. Here, "decrease" may include stepwise decrease, holding a constant level after decrease, etc.

Preferably, a dislocation density distribution which is high in the vicinity of the pn junction and which decreases as the distance from the pn junction increases is established in the high resistivity region and gold is doped at a high concentration to a region having a high dislocation density. When the high resistivity region is adjacent to one pn junction, it is preferable that the killer concentration decreases toward the opposite end to the pn junction over substantially the entire area of the high resistivity region. When the high resistivity region is between two pn junctions, it is preferable that the killer concentration decreases toward a point in the high resistivity region which is substantially a mid-point of the pn junctions.

A forward-biased pn junction passes a current therethrough and a reverse-biased pn junction blocks a current. When the pn junction is switched from the forward-biased state to the reverse-biased state, a reverse current flows immediately after the switching. The reverse recovery time at which the reverse current is reduced to one tenth of an initial current is determined by a recombination rate of minority carriers injected from the pn junction. A distribution of a concentration of the minority carriers injected from the pn junction under the forward-bias state is maximum in the vicinity of the pn junction and decreases as the distance from the pn junction increases. Immediately after the switching, the concentration distribution of the minority carriers remains. Accordingly, the lifetime killers in the vicinity of the pn junction are particularly effective to reduce the reverse recovery time. Since the lifetime of the minority carriers in the high impurity density region is short, the lifetime of the high resistivity $n^-$ or $p^-$ region principally determines the recovery time when a $p^+n^-$ or $p^-n^+$ junction is included.

On the other hand, the greater the quantity of recombination centers (including the lifetime killers) in a depletion layer formed when a reverse voltage is applied across the pn junction, the higher is the leakage current. Thus, the less the amount of lifetime killers is, the more the leakage current is reduced.

Accordingly, in order to provide a semiconductor device which exhibits a low leakage current and short reverse recovery time, it is desirable to increase the lifetime killer concentration in the vicinity of the pn junction and reduce an average killer density in the entire depletion layer as much as possible.

In accordance with a preferred embodiment of the present invention, a dislocation density distribution which is high in the vicinity of the junction and decreases as the distance from the junction increases is established. The lifetime killers such as gold or platinum have a property that they are diffused more in a dislocation area. When the lifetime killers are diffused to the areas of different dislocation densities, the lifetime killer concentration is higher at the higher dislocation density area. Accordingly, when the lifetime killers such as gold or platinum are doped, the lifetime killer concentration distribution is high in the vicinity of the pn junction and decreases as the distance from the pn junction increases in accordance with the dislocation density distribution.

By such a graded killer distribution, the reverse recovery time can be reduced and the leakage current can be relatively reduced.

BRIEF DESCRIPTION OF THE DRAWINGS

The above and other objects, features and advantages of the present invention will be apparent from the following description of the preferred embodiments of the present invention when taken in conjunction with the accompanying drawings, in which.

DETAILED DESCRIPTION

Figure 1A:
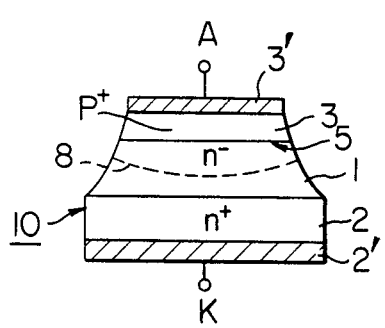
FIGS. 1a and 1b show a schematic sectional view of one embodiment of a diode and a schematic profile of a killer concentration distribution in a high resistivity region of the diode in accordance with the invention, respectively.
Figure 1B:
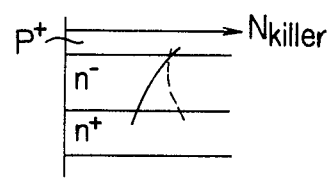

FIGS. 1a and 1b show one embodiment of a diode. A silicon chip 10 has an $n^-$-type high resistivity region 1, an $n^+$-type low resistivity region 2 and a $p^+$-type low resistivity region 3, and has a thickness of approximately 250 μm, for example. A pn junction 5 is formed between the $n^-$-type region 1 and the $p^+$-type region 3. The $n^-$-type region 1 has, for example, a thickness of approximately 130 μm and a resistivity of approximately 10–50 Ω-cm. The thickness is primarily determined by a thickness of a starting material wafer and a process used. The resistivity (impurity concentration) is a primary factor to determine a reverse breakadown voltage of the pn junction 5. In order to provide a high breakdown voltage, a high resistivity (low impurity concentration) is selected. The resistivity of approximately 10–50 Ω-cm is appropriate to provide a rated breakdown voltage of approximately 200–1500 volts. Too thick a high resistivity region 1 is not advisable because a resistance of the diode may be increased. An anode electrode 3′ and a cathode electrode 2′ are ohmically contacted to the p+ region 3 and the n+ region 2, respectively. The p+ region 3 and the n+ region 2 have, for example, impurity concentrations of approximately $10^{18}$–$10^{19}$ atoms cm$^{-3}$ and $10^{20}$–$10^{21}$ atoms cm$^{-3}$, respectively. Usually, those impurity concentrations (resistivities) are selected to be two or more orders of magnitude higher (lower) than that in the high resistivity region. Accordingly, the lifetimes of the minority carriers in the p+ region 3 and the n+ region 2 are negligibly small, when compared with the lifetime of the minority carriers in the n− region 1. The thicknesses of the p+ region 3 and the n+ region 2 are, for example, approximately 45 μm and 75 μm, respectively. Lifetime killers such as gold are doped from an anode surface of the chip 10 to a cathode surface. A killer concentration $N_{killer}$ is determined by a desired diode reverse recovery time. The reverse recovery time is defined as a time period in which a reverse current allowed to flow when a forward-biased diode is switched from the forward-biased state to the reverse-biased state is reduced to one tenth of an initial current.

In the forward-biased state, holes are injected from the p+ region 3 to the n− region 1 across the pn junction 5. The holes act as the minority carriers in the n− region 1 and the concentration of the holes decreases as the distance from the pn junction 5 increases in accordance with the lifetime of the n− region 1. Accordingly, a hole concentration distribution which decreases as the distance from the pn junction 5 increases is established. When the diode is reverse-biased, the pn junction 5 would be reversed-biased. However, a reverse current flows until the holes in the n− region 1 are recombined. In order to rapidly reduce the reverse current, it is effective to reduce the lifetime of the minority carriers in the n− region 1. Particularly, the lifetime in the n− region in the vicinity of the pn junction 5 has a great influence an the recovery time. The lifetimes in the p+ region 3 and the n+ region 2 are so short that they have little influence an the recovery time.

The gold has a large diffusion coefficient and rapidly diffuses throughout a chip. Accordingly, a gold concentration in the chip is primarily determined by a diffusion temperature. Usually, the n+ region is formed by diffusing phosphorus and the p+ region is formed by diffusing boron. It has been found that a process for diffusing phosphorus in a high concentration is apt to form a dislocation density distribution which gradually decreases from a cathode region toward an anode region and gold is diffused more readily in a higher dislocation density region. It has also been found that phosphorus impurity itself acts as a getter for the gold. Accordingly, in a normal process, the diffused gold concentration distribution decreases from the cathode region toward the anode region as shown by a broken line in FIG. 1b. As a result, when it is desired to get a desired gold concentration in the vicinity of the pn junction 5, more gold is to be diffused in the vicinity of the n+ layer which is distant from the pn junction 5.

In accordance with the present embodiment, a lifetime killer concentration in a substantially whole portion of the high resistivity region 1 decreases as the distance from the pn junction 5 increases, as shown by a solid line in FIG. 1b. In other words, a higher gold concentration is established at a higher injected minority carrier concentration region. When the diode is switched from the forward-biased state to the reverse-biased state, the minority carriers are recombined in the high resistivity region or drained to the opposite conductivity type region through the pn junction 5. As the minority carriers are cleared off in the vicinity of the pn junction 5 and the depletion region 8 is formed in the high resistivity region 1 (and slightly in the low resistivity region 2 in some cases), the diode is rendered cut-off. Accordingly, the high killer concentration in the vicinity of the pn junction 5 increases the turn-off speed.

On the other hand, the lifetime killers act not only as the recombination centers but also as generation centers to generate electron-hole pairs. The electron-hole pairs are a cause of a leakage current in the reverse-biased diode. Accordingly, in order to reduce the leakage current, a low killer concentration is desirable. In the present embodiment, an average lifetime killer concentration in the high resistivity region 1 is reduced and a lifetime killer concentration only in a predetermined region is increased. As a result, the leakage current is reduced.

A preferable way to establish such a gold concentration distribution is to establish a dislocation density distribution which decreases as the distance from the pn junction increases in the high resistance region 1 and establish a gold concentration distribution which is high in the high dislocation density region.

A preferred manufacturing process for the diode shown in FIGS. 1a and 1b is now explained with reference to FIGS. 2a to 2d.

Figure 2A:
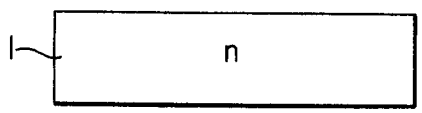
FIGS. 2a to 2d show schematic sectional views for illustrating one embodiment of a manufacturing method of the diode shown in FIGS. 1a and 1b, and FIGS. 3a and 3b show a schematic sectional view of one embodiment of a thyristor and a schematic profile of a killer concentration distribution in a high resistivity region of the thyristor.

In FIG. 2a, the n-type silicon single crystal wafer 1 may have a resistivity of 10–50 Ω-cm and a thickness of approximately 300 μm. At least one of the surfaces of the wafer 1 is chemically etched and/or polished into a mirror surface to remove a strain created in a lapping step.

Figure 2B:
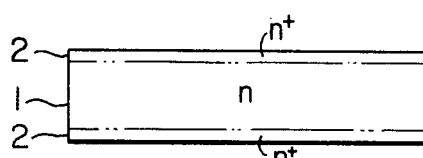

As shown in FIG. 2b, phosphorus is then diffused from the both surfaces of the wafer 1 at a concentration of, for example, $10^{20}$–$10^{21}$ cm$^{-3}$ to form n+ layers 2.

Figure 2C:
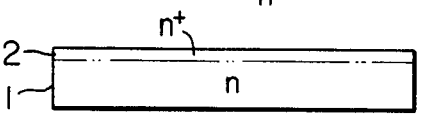

As shown in FIG. 2c, one of the n+ layers 2 is then removed to expose the n− layer 1. The remaining n+ layer 2 has the chemically etched surface or the mirror-finished surface. The one n+ layer 2 is removed by sand blasting or lapping so that a strain remains on the surface. The removal thickness of the layer may be approximately 50 μm.

Figure 2D:
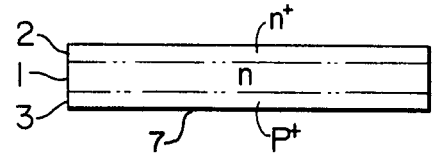

As shown in FIG. 2d, boron is then diffused from the surface 7 of the strained layer at a concentration of, for example, $10^{18}$–$10^{19}$ atoms cm$^{-3}$ to form the p+ layer 3. Since the n+ layer 2 is of higher concentration than the p+ layer 3, masking is not necessary. In this manner, a p+n n+ structure is formed.

As a result, dislocations are generated and grown from the strained layer by a thermal history of the impurity diffusion. Since more dislocations are generated in the surface 7 of the strained layer, a dislocation density in the n layer 1 is high in the vicinity of the pn junction formed by the n layer 1 and the p+ layer 3 and it decreases as the distance from the pn junction increases.

The dislocation density distribution varies with parameters in the formation of the strained layer and a subsequent heating process.

Then, the lifetime killers such as gold are diffused from the surface of the p+ region at a lower temperature than the impurity diffusion temperature. The dislocation density in the high resistivity region is high in the vicinity of the pn junction and decreases as the distance from the pn junction increases. Accordingly, the concentration of the diffused lifetime killers is high in the vicinity of the pn junction and decreases as the distance from the pn junction increases. By positively forming the dislocations in the vicinity of the pn junction, the same reverse recovery time as that of the prior art device is attained at a gold diffusion temperature which is lower, for example by 10° C., than that in the prior art. In this manner, a diode having a low reverse leakage current in the pn junction and a short reverse recovery time is provided.

While the p+n n+ structure has been described, a p+pn+ structure may be used. In this case, a p-type silicon single crystal wafer is used and a p+ layer is formed on the strain-free surface and phosphorus is diffused from the strained surface to form the n+ layer.

The low resistivity region of the same conductivity type as the substrate may be formed by epitaxial growth. The epitaxial growth is very unlikely to form a process-induced defect. The strained layer is formed on the opposite surface to the epitaxial layer and the dislocations are generated and grown in the subsequent heat process.

Figure 3A:
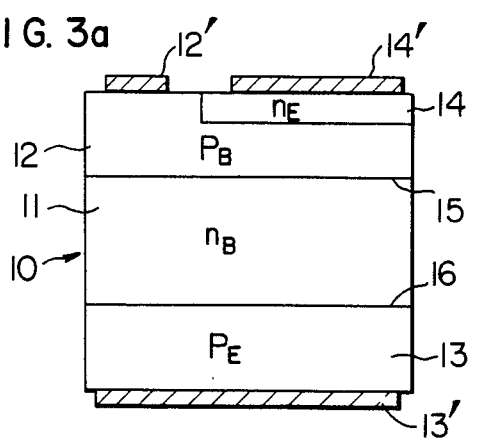
Figure 3B:
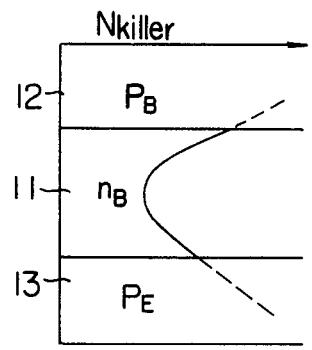

FIG. 3a shows an embodiment of a thyristor. A substrate 10 is used as an n-type base ($n_B$) region and a p-type base ($P_B$) region 12 and a p-type emitter ($P_E$) region 13 are formed in the opposite surfaces thereof. An n-type emitter ($n_E$) region 14 is formed in the p-type base region 12. A cathode electrode 14', a gate electrode 12' and an anode electrode 13' are formed on the n-type emitter region 14, the p-type base region 12 and the p-type emitter region 13, respectively. When a positive potential with respect to a potential of the cathode electrode 14' is applied to the anode electrode 13', a forward-biased state is established and a forward voltage blocking junction is a $P_B\ n_B$ junction 15 which is formed by the layers $n_B$ and $P_B$. Since the impurity concentration $n_B$ of the n-type base region 11 is generally smaller than the impurity concentration $P_B$ of the p-type base region 12, a depletion layer is formed primarily from the $P_B\ n_B$ junction 15 into the n-type base region 11. On the other hand, in a reverse-biased state in which a negative potential is applied to the anode electrode 13', a reverse voltage blocking junction which primarily blocks the reverse voltage is a $P_E\ n_B$ junction 16 formed by the layers $P_E$ and $n_B$. In this case, since the impurity concentration $n_B$ of the n-type base region 11 is lower than the impurity concentration PE of the p-type emitter region 13, a depletion layer is formed primarily from the $P_E\ n_B$ junction 16 into the n-type base region 11. In order to rapidly switch the thyristor from the on-state to the off-state, it is necessary to rapidly form one of the depletion layers described above. To this end, it is necessary to rapidly clear the minority carriers out of the region in which the depletion layer is formed. To this end, a killer impurity distribution $N_{killer}$ which decreases as the distances from the $P_B\ n_B$ junction 15 and the $P_E\ n_B$ junction 16 increase as shown in FIG. 3b is established in the n-type base region 11 which is the high resistivity region. By reducing the average killer density in the n-type base region 11 and increasing the killer density in the vicinities of the both pn junctions, a high speed switching operation and a low leakage current are attained.

A manufacturing method for the thyristor shown in FIGS. 3a and 3b is now explained. The p-type regions 12 and 13 are formed by diffusion in the both surfaces of the n-type high resistivity wafer 10. The n-type region 14 is formed by selective diffusion into the p-type region 12. The strained layers are formed on both surfaces of the wafer 10 before or after the p-type impurity diffusion, and the dislocations are generated and grown in the subsequent heat process. In order to provide a uniform diffusion front of the p-type region, the strained layers are formed after the p-type impurity diffusion, and in order to form the dislocations deeply in the wafer, the strained layers may be formed before the p-type impurity diffusion. The dislocation density in the n-type base region is high in the vicinities of the $P_E\ n_B$ junction and the $P_B\ n_B$ junction and decreases as the distances from the junctions increase. When the lifetime killers are diffused, they are distributed such that the concentration is high in the vicinities of the junctions and lowest at a central portion of the $n_B$ layer as shown in FIG. 3b. By forming the electrodes 12', 13' and 14', a thyristor which exhibits a low leakage current in both forward-biased and reverse-biased states and a high speed response to the reversal of the voltage polarity is provided.

The manufacturing method for the thyristor shown in FIGS. 3a and 3b is not limited to that described above. An epitaxial growth method or an alloying method may be used. The impurity concentrations and the thicknesses of the respective semiconductor regions may be appropriately selected depending on a desired rating.

When all of the four layers $P_E$, $n_B$, $P_B$ and $n_E$ are formed by the impurity diffusion, the lifetime killers may be diffused after the impurity diffusion. When the three layers $P_E$, $n_B$ and $P_B$ are formed by the impurity diffusion and the $n_E$ layer is formed by alloying, the lifetime killers may be diffused after the impurity diffusion, and then the $n_E$ layer is formed by alloying.

While the dislocations are formed by the mechanically strained layers such as by sand blasting or lapping in the above embodiment, they may also be formed by strained layers formed by ion implantation of phosphorus or the like. In this case, after the pn junctions have been formed by the impurity diffusion, the phosphorus is ion-implanted to form the strained layers on the surfaces of the wafer and then the dislocations are generated in the wafer by the heat treatment and then the lifetime killers are diffused.

In accordance with the present embodiment, since more lifetime killers are diffused in the vicinities of the pn junctions containing much carriers, the carriers rapidly recombine in the semiconductor device in the reverse recovery period. When the depletion layer is formed, the leakage current is reduced since the diffusion concentration of the lifetime killers is not uniform and the average concentration is low.

It should be understood that the present invention is not limited to the illustrated embodiments but applicable to a semiconductor device having a pn junction which exhibits a fast recovery time for the switching to the reverse-biased state.

We claim:

1. A semiconductor device including at least one pn junction across which a current is allowed to flow, comprising:
   a first semiconductor region of a first conductivity type having a high resistivity;
   a second semiconductor region of a second conductivity type opposite to said first conductivity type, having an impurity concentration higher than that of said first semiconductor region and disposed adjacent to said first semiconductor region to form one of said at least one pn junction therebetween; and
   a graded distribution of lifetime killer formed in substantially the whole portion of said first semiconductor region and having a killer concentration distribution which decreases with an increase in distance from said one pn junction.

2. A semiconductor device according to claim 1, further comprising:
   graded distribution of dislocation formed in said first semiconductor region for enhancing doping of said lifetime killer and having a dislocation density distribution which decreases with an increase in distance from said one pn junction.

3. A semiconductor device according to claim 2, further comprising:
   a third semiconductor region of said first conductivity type having a resistivity lower than that of said first semiconductor region and disposed adjacent to an end of said first semiconductor region opposite to said second semiconductor region; and
   said distributions of the lifetime killer concentration and the dislocation density decreasing with an increase in distance from said one pn junction in substantially a main part of said first semiconductor region.

4. A semiconductor device according to claim 2, further comprising:
   a third semiconductor region of said second conductivity type having an impurity concentration higher than that of said first semiconductor region and disposed adjacent to an end of said first semiconductor region opposite to said second semiconductor region to form another of said at least one pn junction therebetween; and
   said distributions of dislocation density and lifetime killer concentration decreasing in portions from said one and another pn junctions toward a central portion of the first semiconductor region.

5. A semiconductor device according to claim 3, wherein said first conductivity type is n type and said third semiconductor region is doped with phosphorus of a concentration higher than the impurity concentration of said second semiconductor region.

6. A semiconductor device according to any one of claims 1 to 5, wherein the impurity concentration of said second semiconductor region is at least two orders of magnitude higher than that of said first semiconductor region.

* * * * *